(12) United States Patent
Janesick

(10) Patent No.: US 6,909,126 B1
(45) Date of Patent: *Jun. 21, 2005

(54) IMAGER CELL WITH PINNED TRANSFER GATE

(75) Inventor: Jim Janesick, Huntington Beach, CA (US)

(73) Assignee: ESS Technology, Inc., Freemont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/057,731

(22) Filed: Jan. 24, 2002

Related U.S. Application Data

(63) Continuation-in-part of application No. 09/977,444, filed on Oct. 15, 2001, now Pat. No. 6,762,441.

(51) Int. Cl.⁷ .............................................. H01L 29/78
(52) U.S. Cl. ...................... 257/184; 257/221; 257/222; 257/223; 257/184
(58) Field of Search .......................... 257/184, 221–223, 257/291–292

(56) References Cited

U.S. PATENT DOCUMENTS

| | | | | |
|---|---|---|---|---|
| 4,994,875 A | * | 2/1991 | Hynecek | 257/216 |
| 5,077,592 A | * | 12/1991 | Janesick | 257/248 |
| 5,121,214 A | * | 6/1992 | Turko et al. | 348/249 |
| 6,603,144 B2 | * | 8/2003 | Tsunai | 257/72 |
| 2002/0121655 A1 | * | 9/2002 | Zheng et al. | 257/291 |
| 2002/0121656 A1 | * | 9/2002 | Guidash | 257/292 |

* cited by examiner

Primary Examiner—Minhloan Tran
Assistant Examiner—Thomas L Dickey
(74) Attorney, Agent, or Firm—Farjami & Farjami LLP

(57) ABSTRACT

An imager cell includes a photoreceptor, a sense node, and a pinned transfer gate. The pinned transfer gate is tied to the same potential of a substrate of the imager cell and is disposed between the photoreceptor and the sense node in order to transfer charge between the photoreceptor and the sense node. The imager further includes a reset transistor disposed to reset the sense node, and an output amplifier coupled to the sense node. Control circuitry supplies a photoreceptor readout clock to the photoreceptor. The readout clock includes an integration period and a transfer period. According to various embodiments of the invention, the imager cell provides improved noise performance, selective charge capacities, and improved blue light response beyond that of conventional imager cells.

48 Claims, 8 Drawing Sheets

IMAGER CELL WITH PINNED TRANSFER GATE

RELATED APPLICATION DATA

This continuation-in-part application claims priority to U.S. patent application Ser. No. 09/977,444 filed on Oct. 15, 2001, now U.S. Pat. No. 6,762,441, which application is incorporated by reference to the extent permitted by law.

BACKGROUND OF THE INVENTION

1. Field of the Invention

This invention relates to electronic imaging devices, and in particular to a CMOS imager cell incorporating a "pinned transfer gate".

2. Related Art

Electronic imaging devices ("imagers") find use in a broad range of applications in many distinct fields of technology including the consumer, industrial, medical, defense and scientific fields. Imagers use an array of photoreceptors to convert photons bearing image information into electrical signals representative of the image.

In recent years, CMOS imagers have become a practical implementation option and provide cost and power advantages over other technologies such as charge coupled devices (CCD). A conventional CMOS imager is typically structured as an array of imager cells, each of which includes a photoreceptor approximately reset to a known potential in preparation for integration and readout of an image. The performance of a CMOS imager depends heavily on the performance of the individual imager cells.

In the past, the imager cells took the form of either passive photoreceptor cells, active photoreceptor cells, or transfer gate active photoreceptor cells. The passive photoreceptor cells typically included a photodiode for collecting photocharge and a single access transistor to connect the photodiode to a readout bus. However, passive photoreceptor cells, while having high quantum efficiency, were plagued with high read noise. As a result, imagers began to incorporate active photoreceptor cells. The active photoreceptor cells included a photoreceptor, and either three or four support transistors. The support transistors included a reset transistor, source follower transistor (for buffering and amplifying the collector photocharge), and an access transistor for connecting the photoreceptor to a readout bus. In transfer gate active photoreceptor cells, a fourth transfer gate transistor was used to transfer photocharge from the photoreceptor to a sense node, thereby allowing correlated double sampling, and a corresponding decrease in read and dark current noise.

Active photoreceptor cells, however, exposed far less photoreceptor area to incident light due to the overlying support transistor structures. Furthermore, the n+ contacts used in active photoreceptor cells generated significant dark current, thereby undesirably altering images during integration and readout. In addition, prior photoreceptor cells were not tailored to provide adequate response over a wide range of light levels, nor to blue light in particular.

A need exists for an improved imager cell that addresses the problems noted above and other previously experienced.

SUMMARY

An improved imager cell is arrived at by incorporating a "pinned transfer gate" between a photoreceptor and a sense node. The imager cell may be broadly conceptualized as a light detecting element with low noise characteristics that is configurable for a wide range of charge capacity, for a wide range of light levels, with enhanced blue light response, as compared to conventional imager cell implementations.

One implementation of the imager cell includes a photoreceptor, a sense node, and a pinned transfer gate. The pinned transfer gate is disposed to transfer charge between the photoreceptor and the sense node. As discussed in more detail below, the pinned transfer gate may be a shallow p-doped pinned region in an n-doped transfer region. The photoreceptor, as examples, may be implemented as a photogate or a photodiode, with an accompanying photoreceptor readout gate.

The imager cell may further include a reset transistor disposed to reset the sense node, and an output amplifier (for example, a source follower amplifier) coupled to the sense node. Control circuitry supplies a photoreceptor readout clock to the photoreceptor. The readout clock includes an integration period and a transfer period. During the integration period, the readout clock is at an integration voltage V+ which may be varied to setup a desired charge capacity in the photoreceptor.

Modifications to the imager cell may be included to enhance blue light response. In particular, the photoreceptor may have some gate material removed to form a photoreceptor readout gate light aperture above the photoreceptor (also referred to a "poly hole"). The light aperture allows light to pass directly into the photoreceptor without passing through the gate which absorbs blue photons before they enter the photoreceptor. In addition, dark current performance is enhanced by fabricating a pinned aperture region under the light aperture.

In an alternative implementation, the thickness of the photoreceptor readout gate is adjusted to enhance blue light response of the imager cell. In particular, the photoreceptor readout gate is made relatively thin (also referred to as a "thin gate"). Generally, the photoreceptor readout gate is less than 2000 Angstroms thick, and may vary depending on considerations which are explained in more detail below.

Related methods of manufacturing the imager cells are discussed below.

The control circuitry associated with the imager cell provides several modes of operation. One mode is a "snap" mode, and another mode is a selective charge capacity mode. In the snap mode, the control circuitry supplies a photoreceptor readout clock simultaneously to a set of photoreceptor readout gates. As a result, accumulated charge in each photoreceptor is transferred to the sense node for each respective photoreceptor in one clock cycle. The snap mode thereby provides a "snapshot" of an image at an instant in time (on the order of one micro-second). In the selective charge capacity mode, the integration voltage V+ is set according to a desired charge capacity for the imager cell.

Other implementations, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

DETAILED DESCRIPTION OF THE PREFERRED EMBODIMENTS

Figure 1:
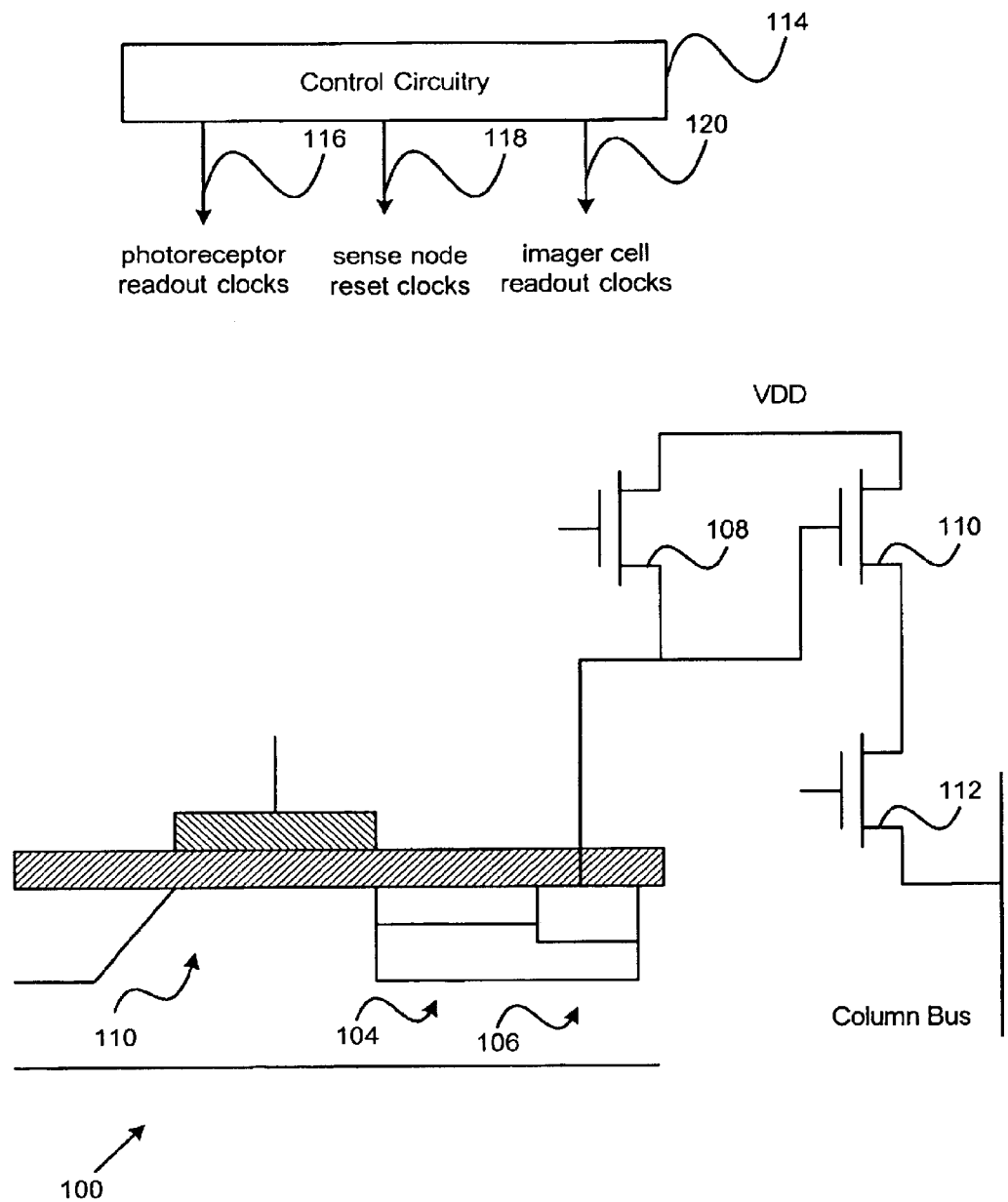
FIG. 1 shows a pinned transfer gate (PTG) pixel with control and readout circuitry.

With regard first to FIG. 1, an imager cell 100 (descried in more detail below) includes a photoreceptor 102, a transfer gate 104, and a sense node 106. A reset transistor 108 is provided to reset the sense node 106, and an output amplifier 110 provides sense node buffering when the sense node 106 is readout to the column bus through the select transistor 112. Also illustrated in FIG. 1 is control circuitry 114 that produces photoreceptor readout clocks 116, sense node reset clocks 118, and imager cell readout clocks 120. The control circuitry 114 may generally be implemented as a conventional CMOS imager controller, except with regard to the operating modes described in more detail below and with regard to the applicable integration voltages that setup preselected charge capacity levels in the photoreceptor 102.

Figure 2:
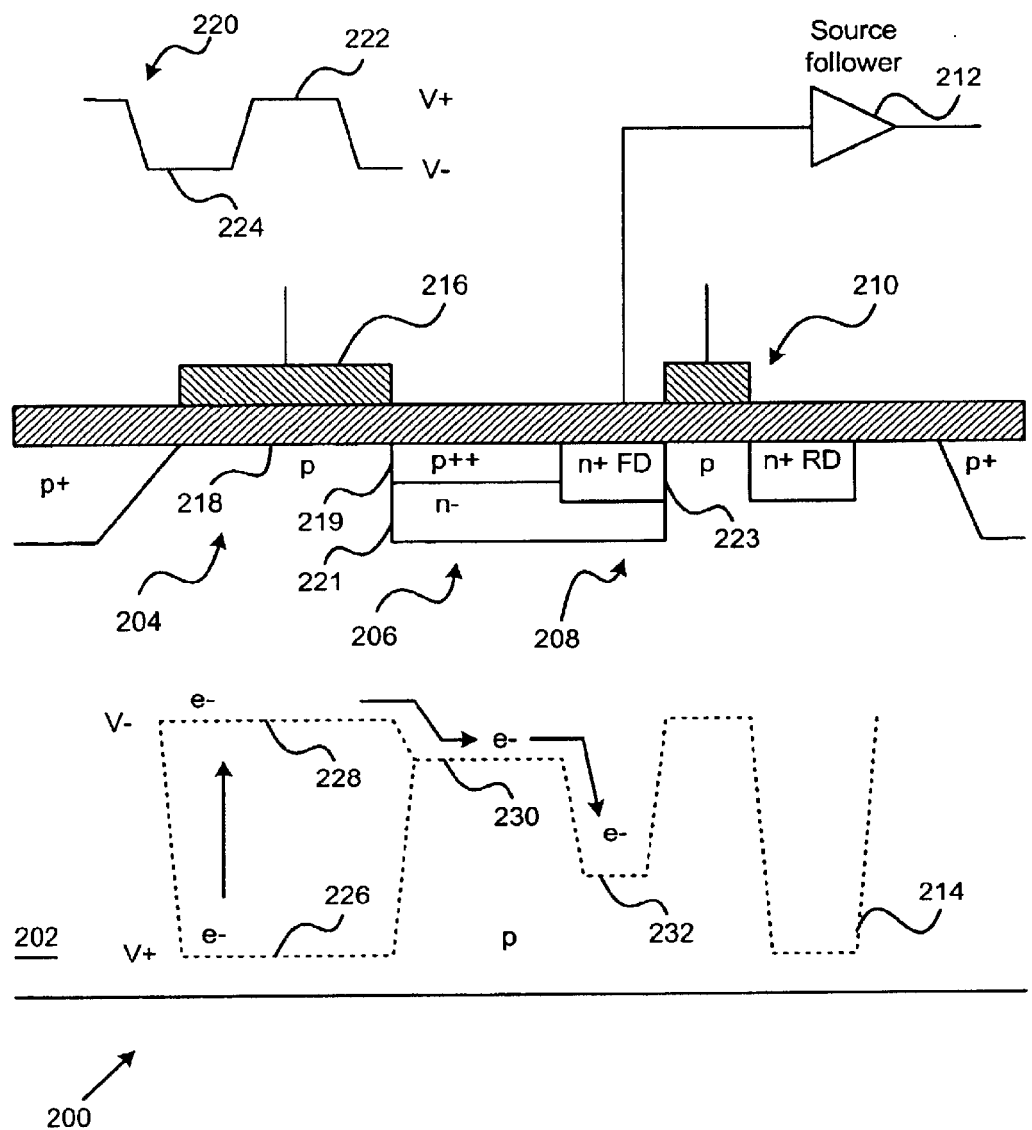
FIG. 2 shows a PTG pixel with a poly photoreceptor.

Turning next to FIG. 2, that figure presents a more detailed view of an imager cell 200. The imager cell 200 is formed in a p-type substrate 202 and includes a photoreceptor 204, pinned transfer gate 206 and sense node 208. A reset transistor 210 provides a mechanism for resetting the sense node 208 to an initial level, while the source follower output amplifier 212 provides sense node 208 output buffering and amplification. A potential well diagram 214 illustrates the variation in electric potential across the imager cell 200.

As shown in FIG. 2, the photoreceptor 204 is formed as a "poly photogate" including a photoreceptor readout gate 216, supporting photoreceptor gate oxide 218, and the p-type substrate 202. Other implementations of photoreceptors are also suitable however, including photodiodes.

The pinned transfer gate 206 is formed from a shallow p++implanted pinned region 219 in an n-implanted transfer region 221 in the p-type substrate 202. The sense node 208 is formed from an implanted n+ contact region 223 and p-type epitaxial substrate 202. Note that the pinned transfer gate 206 is disposed between the photoreceptor 204 and the sense node 208 in order to transfer charge between the photoreceptor 204 and the sense node 208.

Note also that the pinned transfer region omits a transistor gate structure (e.g., such as the photoreceptor readout gate 216 provided for the photoreceptor 204). Instead, the pinning sets up a potential well profile that allows charge to transfer through the pinned transfer gate 206 depending on the photoreceptor readout clocks 116 as will be discussed in more detail below.

The pinned transfer gate is "pinned" because the p++ doped pinned region 219 is tied (or "pinned") to the potential of the substrate 202, typically ground or zero volts. Pinning the transfer generally suppresses dark current, which leads to an improved signal to noise ratio because fewer dark current electrons (i.e., noise electrons) contribute to the output signal.

The operation of the photoreceptor 200 is discussed with reference to the potential well diagram 214 and the photoreceptor readout clock 220. Note that the photoreceptor readout clock 220 varies between a V+ level during an integration period 222 and a V− level during a readout period 224. The duration of the integration period 222 and the readout period 224 vary in accordance with the desired operating speed of the photoreceptor 200. In one implementation, for example, the duration of the integration period 222 may be approximately 1 second, while the duration of the readout period 224 may be approximately $1/30^{th}$ of a second.

Note that during the integration period 222, the integration voltage V+establishes the integration potential well 226 in the substrate 202. At this time, photons incident on the photoreceptor 202 produce electrons that are captured in the integration potential well 226.

The extent of the integration potential well 206 varies with the integration voltage V+, and may be selected from one of many integration voltages chosen to setup charge capacity levels in the photoreceptor 202.

As the integration voltage V+ increases, so does the charge capacity level for the photoreceptor 202. Thus, during conditions of bright light, for example, the integration voltage V+ may be increased to enhance the charge collection capacity level in the photoreceptor 202 (and thereby reduce blooming or washout, as examples). On the other hand, when low light levels exist, the integration voltage may be decreased, if desired, to setup a correspondingly smaller charge collection capacity in the photoreceptor 202. To that end, the control circuitry 114 may be preprogrammed with a selection of integration voltages to selectively apply to the photoreceptor readout gate 216.

After the integration period 222, the control circuitry 114 applies the readout voltage V− to establish the readout potential well 228. Note that the readout potential well 228 is shallower than the transfer potential well 230, established by the pinned transfer gate 206. As a result, electrons captured by the integration potential well 226 propagate through the transfer potential well 230 and into the sense node potential well 232. Under control of the imager cell readout clock 120 (which may activate, for example, the select transistor 112), the source follower 212 amplifies and buffers the resultant potential at the sense node 208 onto the column bus. After readout, the reset gate 210 activates under control of the sense node reset clock; 118 to approximately reset the sense node 208 to a known potential. In other words, the control circuitry 114 may implement "progressive scanning" to readout one line of imager cells at a time.

The imager cell 200 may also operate in what is referred to as a "snap" mode. During the snap mode, the control circuitry 114 asserts the photoreceptor readout clocks 116 for multiple lines of imager cells 200 simultaneously. The result is that the charge collected in a set of photoreceptors 202 is simultaneously transferred into the sense nodes 208 of the respective photoreceptors 202. The snap mode thus provides a snapshot at an instant in time of the charge collected in the set of photoreceptors 202 to obtain image information undisturbed by noise arising during, for example, a sequential readout process.

As an example, numerous imager cells 200 may be organized into an array to form a CMOS imager. Two or more imager cells 200 may then be selected as a set of photoreceptors 202 for the next snap operation. As examples, the set may include all the photoreceptors 202 that form a rectangular sub-array in the center of the CMOS imager, a stripe of predetermined width vertically through the center of the CMOS imager, or every other imager cell 200 in the CMOS imager.

Figure 3:
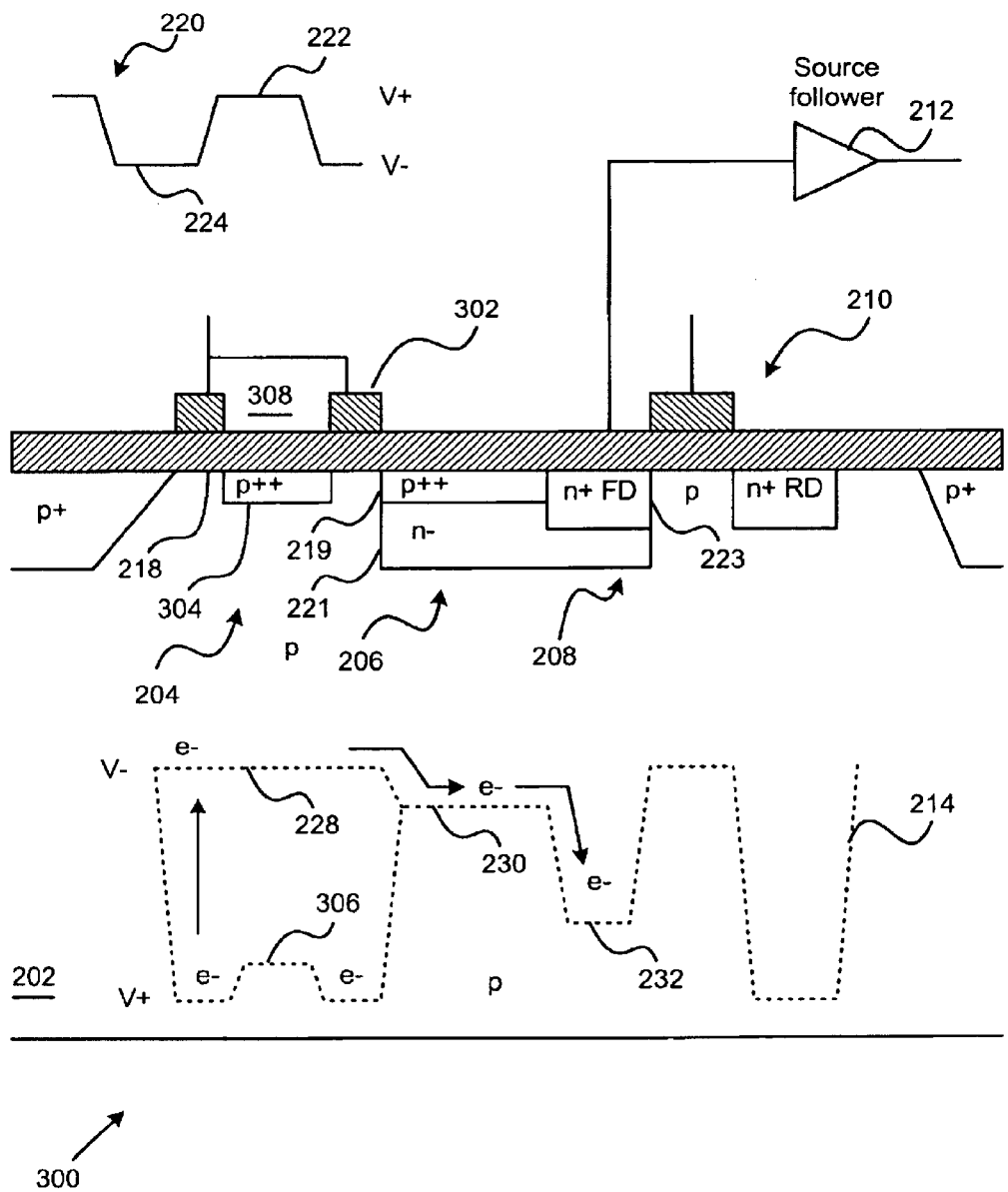
FIG. 3 shows a PTG pixel cell with a "poly hole" photoreceptor.

Turning next to FIG. 3, that figure shows an implementation of an imager cell 300 employing a poly-hole gate 302 and an optional p++pinned aperture region 304 (with a corresponding integration potential well 306 in the substrate 202). The operation of the imager cell 300 with regard to the photoreceptor readout clock 220 is substantially similar to that described above with regard to the imager cell 200 in FIG. 2. Note, however, that the imager cell 300 provides enhanced response to blue light because the photoreceptor readout gate 216 has had material removed to form the photoreceptor readout gate light aperture 308 above the photoreceptor 204. As a result, many photons impinge up the photoreceptor 204 without passing through polysilicon gate material. Because blue photons tend to be absorbed when passing through polysilicon gate material, the light aperture 308 allows more blue photons to reach the photoreceptor 204. The imager cell 300 has correspondingly increased response to blue light. Note also that a micro-lens (not illustrated) focused on the "poly hole" region may be provided above the light aperture 308 to help focus photons into the photoreceptor 204.

As noted above, the p++ pinned aperture region 304 may optimally be fabricated in the photoreceptor 204. The pinned aperture region 304 (like the pinned transfer gate 206) is tied to the substrate 202 potential. As a result, the pinned aperture region 304 decreases the dark noise generated in the photoreceptor 204 and improved image quality results. Furthermore, the gate oxide 218 in the exposed pinned aperture region 304 optionally carries an anti-reflective coating formed from, as an example, 100 Angstroms of oxide and 250 Angstroms of silicon nitride. The anti-reflective coating reduces reflection loss.

Figure 4:
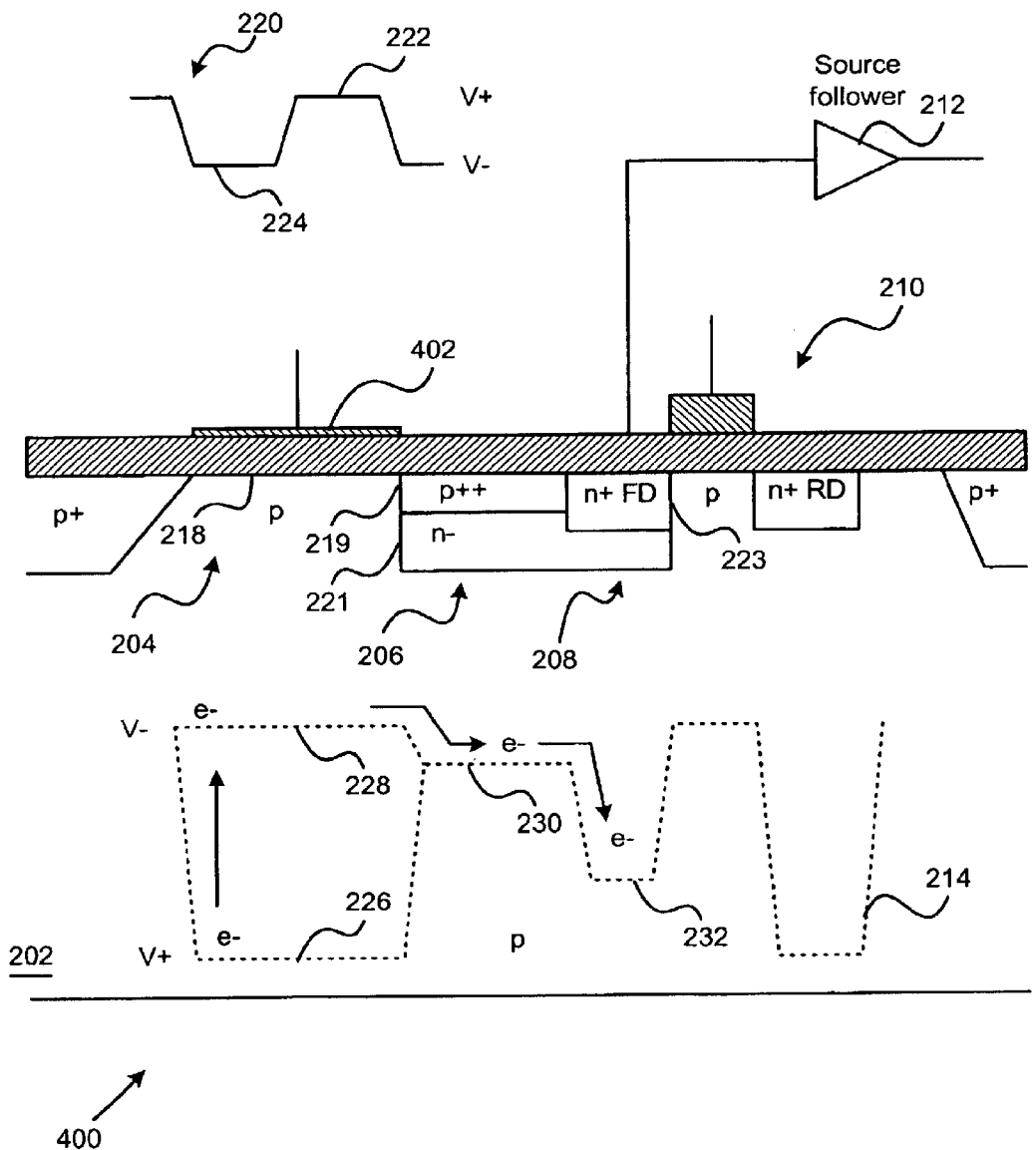
FIG. 4 shows a PTG pixel cell with a "thin gate" photoreceptor.

FIG. 4 presents an additional implementation of an imager cell 400. The imager cell 400 includes a thin photoreceptor readout gate 402. The imager cell 400, like the imager cell 300, provides increased sensitivity to blue light. Generally, a photoreceptor readout gate more than 2000 Angstroms thick absorbs significant amounts of blue light. Thus, the thin photoreceptor readout gate 402 is fabricated generally 2000 Angstroms or less in thickness, for example between 50 and 2000 Angstroms. However, the thickness of the thin photoreceptor readout gate 402 may also be varied in accordance with the charge capacity desired in the photoreceptor (which depends on the voltage applied to the photoreceptor readout gate during integration). For example, for 3.3 volt operation a gate thickness of 50–65 Angstroms may be used, while for 5.0 volt operation a gate thickness of 100–110 Angstroms may be used.

The operation of the imager cell 400 with regard to the photoreceptor readout clock 220 is similar to that described above with regard to the imager cell 200 in FIG. 2.

Figure 5:
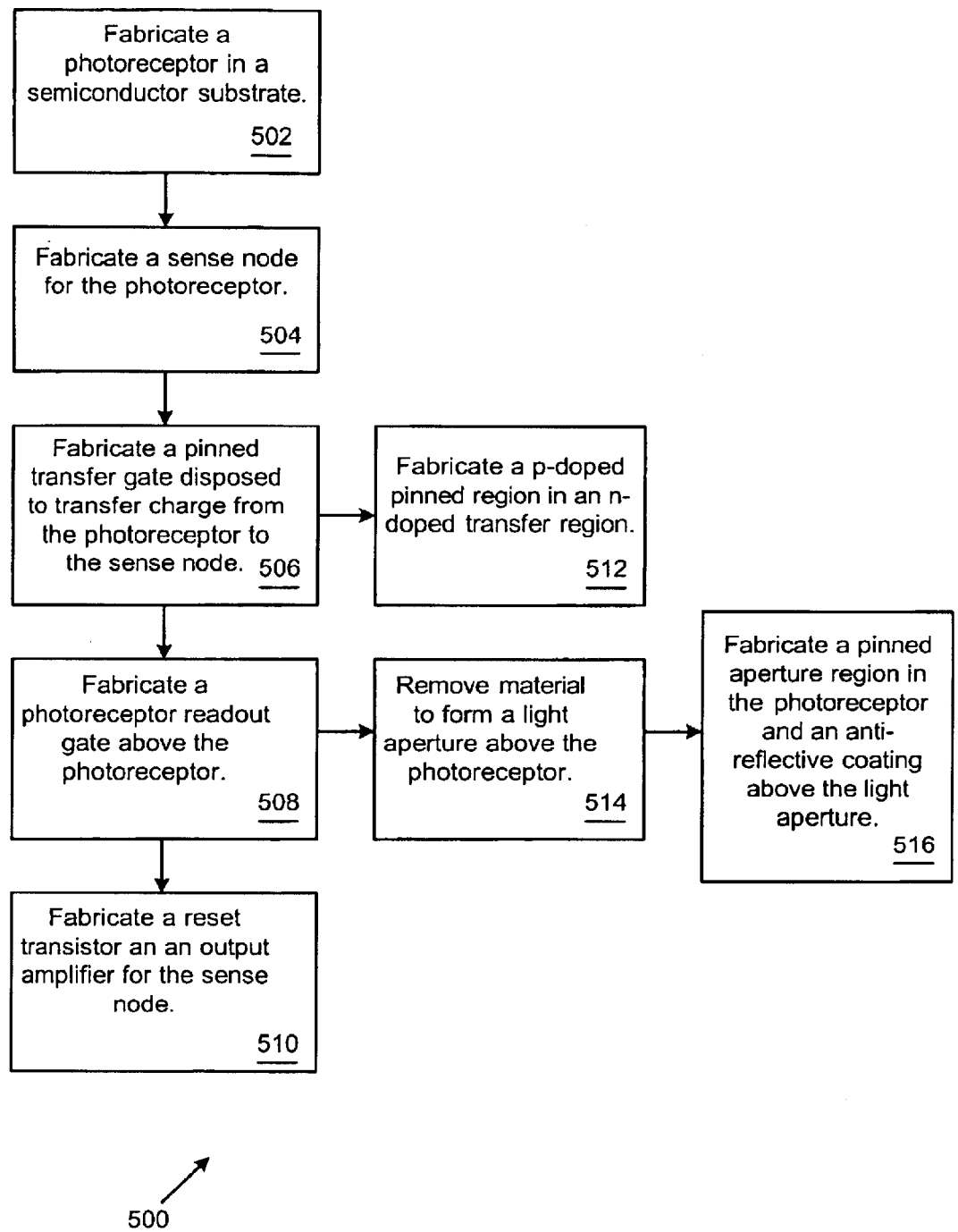
FIG. 5 depicts a method of fabricating a an imager cell.

Turning next to FIG. 5, a flow diagram illustrates a method 500 for fabricating an imager cell. The method 500 fabricates (502) a photoreceptor 204, fabricates (504) a sense node 208, and fabricates (506) a pinned transfer gate 206 disposed to transfer charge from the photoreceptor 204 to the sense node 208. Generally, the photoreceptor 204, sense node 208, and pinned transfer gate 206 (and other imager cell structures) are not created sequentially. Rather, using established fabrication processes, portions of the imager cells may be fabricated in the same fabrication process step (e.g., a p-doping step).

In addition, the method 500 fabricates (508) a photoreceptor readout gate, e.g., 216, above the photoreceptor 204. As discussed above with regard to FIG. 4, the photoreceptor readout gate may be fabricated with a thickness of less than 2000 Angstroms, for example, 400 Angstroms. The method 500 also fabricates (510) a reset transistor 108 and an output amplifier 110 for the sense node 208. Note that the pinned transfer gate 206 is generally fabricated (512) as a p-doped pinned region in an n-doped transfer region. As discussed above with regard to FIG. 3, the method 500 may fabricate (512) a light aperture 308 above the photoreceptor 204, as well as fabricate (514) a pinned aperture region 304 in the photoreceptor 204 and an anti-reflective coating above the photoreceptor 204.

Figure 6:
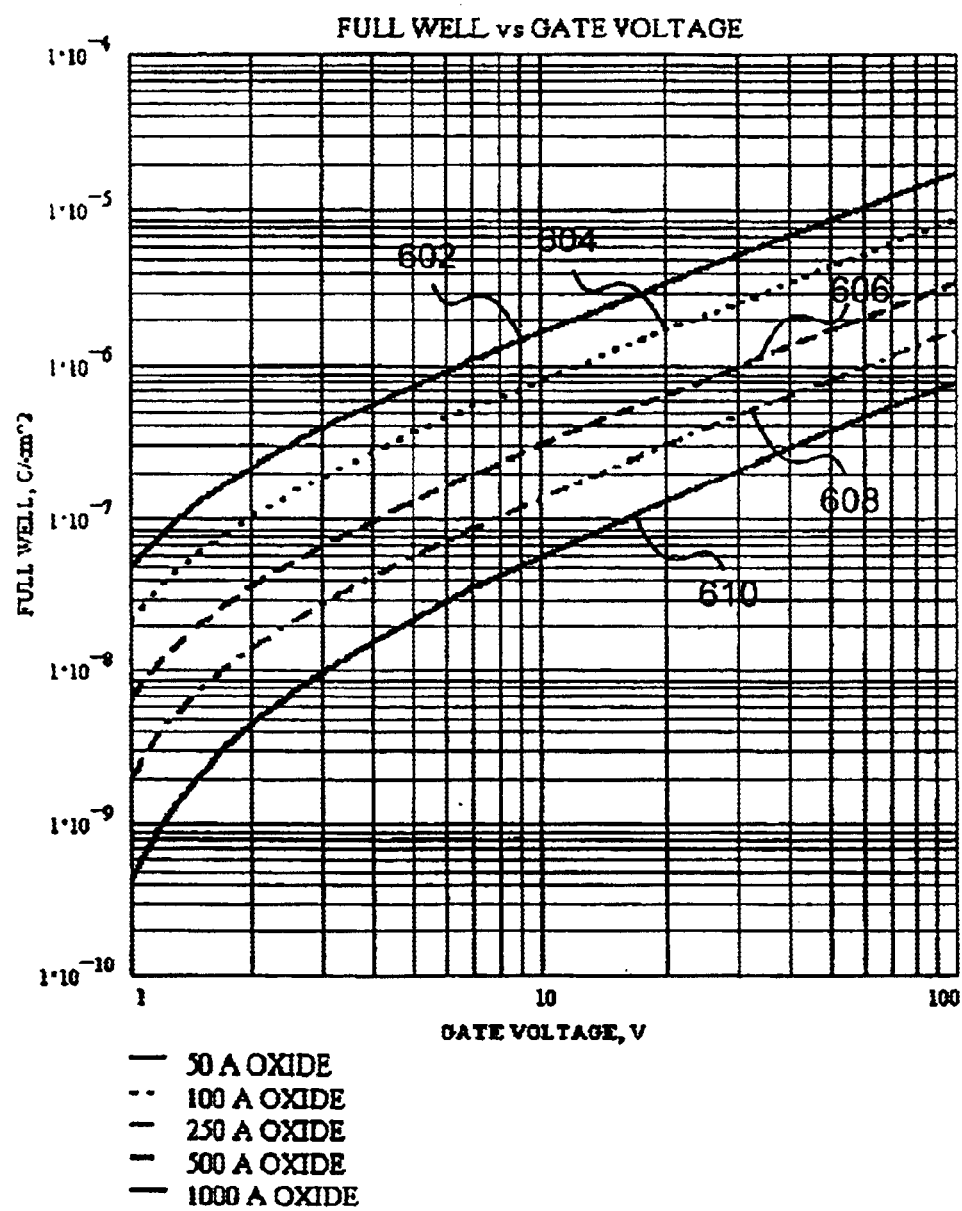
FIG. 6 shows a plot of full well curves as a function of integration voltage for 10-ohm silicon.

With regard next to FIG. 6, a plot 600 illustrates full well curves 602–610 (i.e., charge capacity levels) in units of Coulombs per square centimeter as a function of integration voltage V+. The model giving rise to FIG. 6 assumes 10-ohm silicon, a transfer gate barrier of 0.4 V, and a thermal barrier of 0.3 V. Curve 602 represents the full well curve for 50 Angstroms of photoreceptor gate oxide 218, curve 604 represents the full well curve for 100 Angstroms of photoreceptor gate oxide 218, and curve 606 represents the full well curve for 250 Angstroms of photoreceptor gate oxide 218. Similarly, curve 608 represents the full well curve for 500 Angstroms of photoreceptor gate oxide 218, and curve 610 represents the full well curve for 1000 Angstroms of photoreceptor gate oxide 218. Thus, for example, for 50 Angstroms of photoreceptor gate oxide 218, the full well is $2 \times 10^{-7}$ C/cm$^2$.

Figure 7:
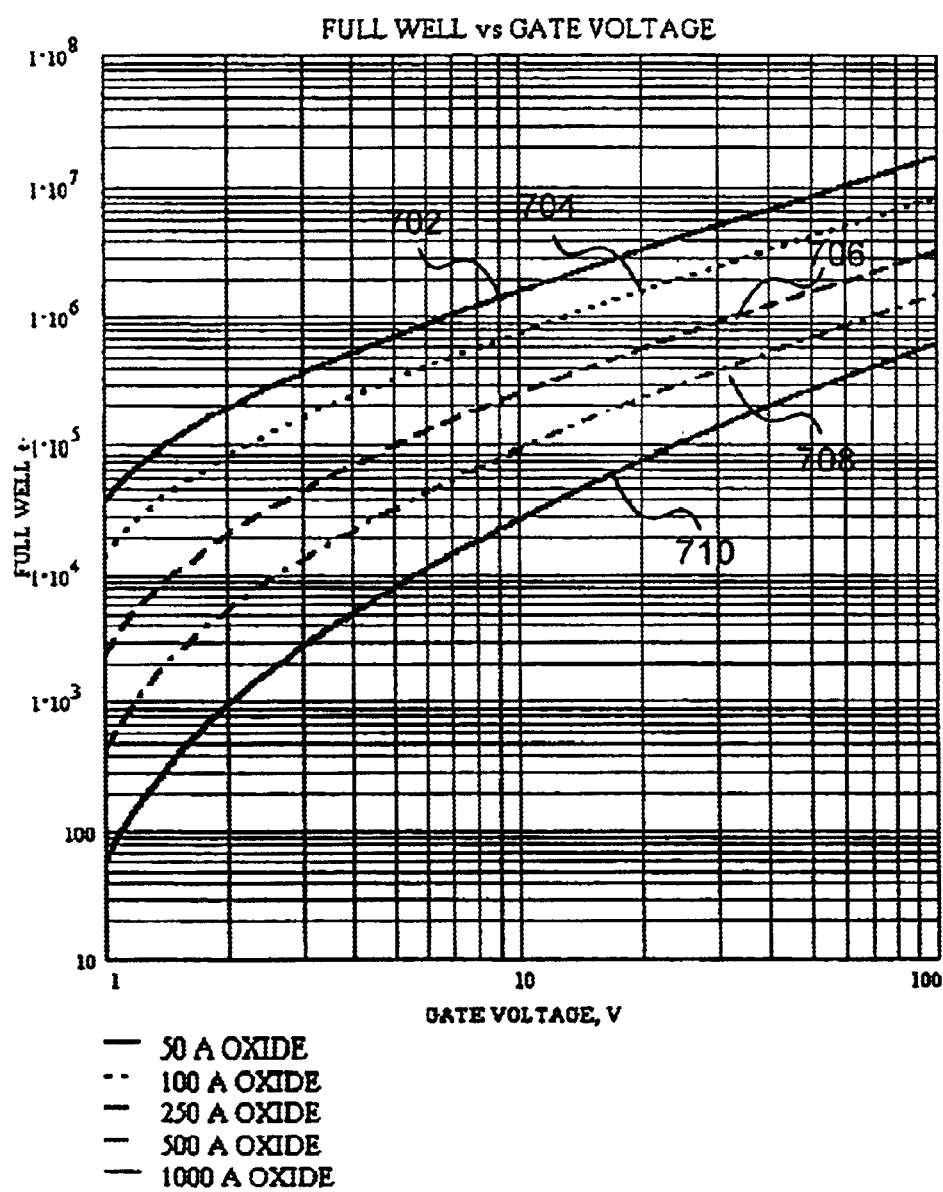
FIG. 7 shows a plot of full well curves as a function of integration voltage for 1-ohm silicon.

FIG. 7 provides a similar plot 700 of full well curves 702–710 (i.e., charge capacity levels) for 1-ohm silicon. The plot 700, however, is shown in units of electrons assuming a 4 micron×4 micron collection region for the photoreceptor 204. Curve 702 represents the full well curve for 50 Angstroms of photoreceptor gate oxide 218, curve 704 represents the full well curve for 100 Angstroms of photoreceptor gate oxide 218, and curve 706 represents the full well curve for 250 Angstroms of photoreceptor gate oxide 218. Similarly, curve 708 represents the full well curve for 500 Angstroms of photoreceptor gate oxide 218, and curve 710 represents the full well curve for 1000 Angstroms of photoreceptor gate oxide 218.

Thus, the imager cells provide enhanced performance light sensors. The imager cells have improved noise performance and improved blue light response using a thin gate or light aperture. The control circuitry for the imager cells supports a snap mode for providing a snapshot at an instant in time of the charge collected in a set of photoreceptors to obtain image information undisturbed by noise. Furthermore, the control circuitry provides a selective charge capacity mode in which the desired charge capacity of a photoreceptor may be setup by choosing an appropriate integration voltage V+.

Figure 8:
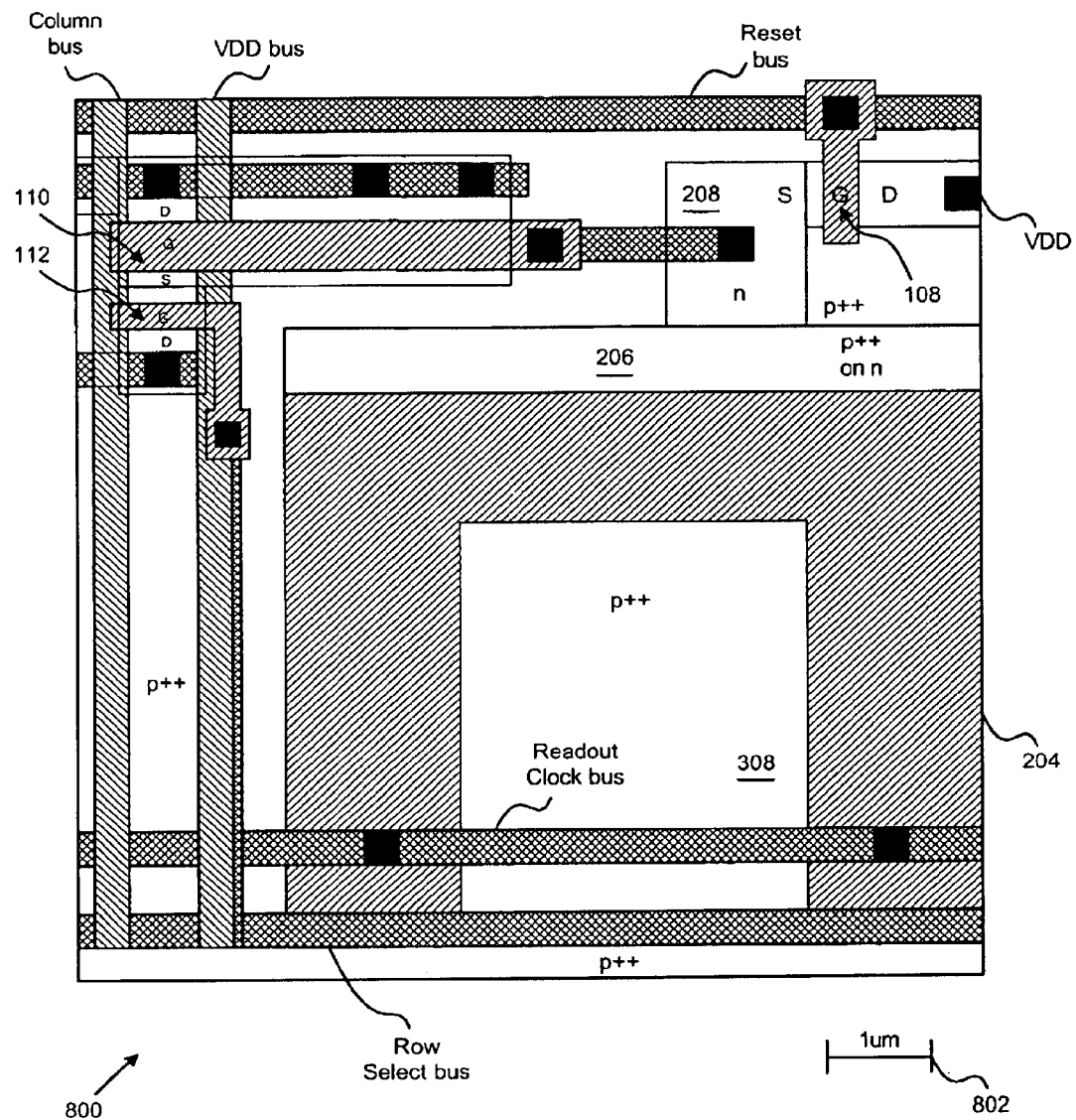
FIG. 8 shows an exemplary layout of a "poly hole" photoreceptor.

With regard next to FIG. 8, that figure shows a layout 800 of a "poly hole" photoreceptor. The layout 800 shows the location of the reset transistor 108, the output amplifier 110, and the select transistor 112. In addition, the layout 800 provides an exemplary layout for the photoreceptor 204, pinned transfer gate 206, and sense node 208. Note also the photoreceptor readout gate light aperture 308 or "poly hole" centrally disposed over the photoreceptor 204. The light aperture 308 need not be centrally positioned, however. Note that an approximate 1 micron scale 802 is present in FIG. 8.

However, the dimensions of each structure may vary widely to suit the application to be implemented.

While various embodiments of the application have been described, it will be apparent to those of ordinary skill in the art that many more embodiments and implementations (e.g., using a different form or representation of quantization of the photoreceptor noise range) are possible that are within the scope of this invention. Accordingly, the invention is not to be restricted except in light of the attached claims and their equivalents.

What is claimed is:

1. An imager cell including a substrate having a potential, the imager cell comprising:
    a photoreceptor;
    a sense node; and
    a pinned transfer gate disposed between the photoreceptor and the sense node, the pinned transfer gate being tied to the potential of the substrate and further being configured to transfer charge between the photoreceptor and the sense node;
    wherein a voltage determined by the charge transferred between the photoreceptor and the sense node is read out of the imager cell at the sense node.

2. An imager cell as defined in claim 1, wherein the pinned transfer gate comprises a p-doped pinned region in an n-doped transfer region.

3. An imager cell as defined in claim 1, further comprising a photoreceptor readout gate disposed above the photoreceptor.

4. An imager cell as defined in claim 1, wherein the photoreceptor comprises a photogate.

5. An imager cell as defined in claim 1, wherein the photoreceptor comprises a photodiode.

6. An imager cell as defined in claim 1, further comprising a reset transistor disposed to reset the sense node.

7. An imager cell as defined in claim 1, further comprising an output amplifier coupled to the sense node.

8. An imager cell as defined in claim 7, wherein the output amplifier is a source follower amplifier.

9. An imager cell as defined in claim 3, further comprising a readout clock connection coupled to the photoreceptor readout gate.

10. An imager cell as defined in claim 9, further comprising control circuitry coupled to the readout clock connection, the control circuitry supplying a photoreceptor readout clock.

11. An imager cell as defined in claim 10, wherein the photoreceptor readout clock is characterized by a V+ level applied during an integration period, and a V− level applied during a transfer period.

12. An imager cell including a substrate having a potential, the imager cell comprising:
    a photoreceptor;
    a sense node;
    a pinned transfer gate disposed between the photoreceptor and the sense node, the pinned transfer gate being tied to the potential of the substrate and further being configured to transfer charge between the photoreceptor and the sense node; and
    a photoreceptor readout gate disposed above the photoreceptor, the photoreceptor readout gate having material removed to form a photoreceptor readout gate light aperture above the photoreceptor, whereby the photoreceptor provides enhanced response to blue light;
    wherein a voltage determined by the charge transferred between the photoreceptor and the sense node is read out of the imager cell at the sense node.

13. An imager cell as defined in claim 12, further comprising a pinned aperture region under the photoreceptor readout gate light aperture.

14. An imager cell as defined in claim 12, wherein the pinned transfer gate comprises a p-doped pinned region in an n-doped transfer region.

15. An imager cell as defined in claim 12, wherein the photoreceptor comprises a photo gate.

16. An imager cell as defined in claim 12, wherein the photoreceptor comprises a photodiode.

17. An imager cell as defined in claim 12, further comprising a reset transistor disposed to reset the sense node.

18. An imager cell as defined in claim 12, further comprising an output amplifier coupled to the sense node.

19. An imager cell as defined in claim 18, further comprising an anti-reflective coating disposed above the photoreceptor.

20. An imager cell as defined in claim 12, further comprising a readout clock connection coupled to the photoreceptor readout gate.

21. An imager cell as defined in claim 20, further comprising control circuitry coupled to the readout clock connection, the control circuitry supplying a photoreceptor readout clock.

22. An imager cell as defined in claim 21, wherein the photoreceptor readout clock is characterized by a V+ level applied during an integration period, and a V− level applied during a transfer period.

23. An imager cell including a substrate having a potential, the imager cell comprising:
    a photoreceptor;
    a sense node;
    a pinned transfer gate disposed between the photoreceptor and the sense node, the pinned transfer gate being tied to the potential of the substrate and further being configured to transfer charge between the photoreceptor and the sense node; and
    a photoreceptor readout gate disposed above the photoreceptor, the photoreceptor readout gate characterized by a photoreceptor readout gate thickness of less than 2000 Angstroms, whereby the photoreceptor provides enhanced response to blue light;
    wherein a voltage determined by the charge transferred between the photoreceptor and the sense node is read out of the imager cell at the sense node.

24. An imager cell as defined in claim 23, wherein the photoreceptor readout gate thickness is less than 1000 Angstroms.

25. An imager cell as defined in claim 23, wherein the photoreceptor readout gate thickness is less than 500 Angstroms.

26. An imager cell as defined in claim 23, wherein the pinned transfer gate comprises a p-doped pinned region in an n-doped transfer region.

27. An imager cell as defined in claim 23, wherein the photoreceptor comprises a photogate.

28. An imager cell as defined in claim 23, wherein the photoreceptor comprises a photodiode.

29. An imager cell as defined in claim 23, further comprising a reset transistor disposed to reset the sense node.

30. An imager cell as defined in claim 23, further comprising an output amplifier coupled to the sense node.

31. An imager cell as defined in claim 28, wherein the output amplifier is a source follower amplifier.

32. An imager cell as defined in claim 23, further comprising a readout clock connection coupled to the photoreceptor readout gate.

33. An imager cell as defined in claim 32, further comprising control circuitry coupled to the readout clock connection, the control circuitry supplying a photoreceptor readout clock.

34. An imager cell as defined in claim 33, wherein the photoreceptor readout clock is characterized by a V+ level applied during an integration period, and a V− level applied during a transfer period.

35. An imager cell including a substrate having a potential, the imager cell comprising:
   means for detecting incident photons;
   means for storing transferred charge for readout; and
   a pinned transfer gate disposed between the means for detecting and the means for storing, the pinned transfer gate being tied to the potential of the substrate and further being configured to transfer charge between the means for detecting and the means for storing;
   wherein a voltage determined by the charge transferred between the means for detecting and the means for storing is read out of the imager cell at the sense node.

36. An imager cell as defined in claim 35, wherein the pinned transfer gate comprises a p-doped pinned region in an n-doped transfer region.

37. An imager cell as defined in claim 35, further comprising means for transferring charge from the means for detecting incident photons to the pinned transfer gate.

38. An imager cell as defined in claim 35, further comprising means for resetting the means for storing transferred charge.

39. An imager cell as defined in claim 35, further comprising means for amplifying the transferred charge.

40. An imager cell as defined in claim 37, further comprising means for clocking the means for transferring charge.

41. An imager cell as defined in claim 40, wherein the means for clocking is characterized by a V+ level applied during an integration period and a V− level applied during a readout transfer period.

42. An imager cell as defined in claim 37, wherein the means for transferring charge comprises a photoreceptor readout gate characterized by a thickness of less than 2000 Angstroms.

43. An imager cell as defined in claim 38, wherein the means for transferring charge comprises a photoreceptor readout gate characterized by a thickness of less than 1000 Angstroms.

44. An imager cell as defined in claim 38, wherein the means for transferring charge comprises a photoreceptor readout gate characterized by a thickness of less than 500 Angstroms.

45. An imager cell as defined in claim 37, wherein the means for transferring charge comprises a photoreceptor readout gate having material removed to form a photoreceptor readout gate light aperture above the means for detecting incident photons.

46. An imager cell as defined in claim 45, further comprising a pinned aperture region under the photoreceptor readout gate light aperture.

47. An imaging array including a substrate having a potential, the imaging array comprising:
   an array of imager cells, each imager cell comprising a photoreceptor, a sense node, and a photoreceptor readout gate; and wherein at least one of the imager cells further comprises a pinned transfer gate disposed between the photoreceptor and the sense node, the pinned transfer gate being tide to the potential of the substrate and further being configured to transfer charge between the photoreceptor and the sense node; and
   control circuitry coupled to each photoreceptor readout gate for supplying a photoreceptor readout clock simultaneously to a set of photoreceptors in the array,
   whereby accumulated charge in each photoreceptor is transferred to its sense node to provide a snapshot of an image acquired by the imaging array;
   wherein a voltage that is determined by the accumulated charge in each photoreceptor that is transferred to its sense node is read out of each imager cell.

48. An imager cell including a substrate having a potential, the imager cell comprising:
   a photoreceptor including a photoreceptor readout gate;
   a sense node;
   a pinned transfer gate disposed between the photoreceptor and the sense node, the pinned transfer gate being tied to the potential of the substrate and further being configured to transfer charge between the photoreceptor and the sense node; and
   control circuitry coupled to the photoreceptor readout gate for applying a photoreceptor readout clock to the photoreceptor readout gate, the photoreceptor readout clock comprising an integration period characterized by an integration voltage selected from a plurality of predetermined integration voltages to setup a preselected charge capacity level in the photoreceptor;
   wherein a voltage determined by the charge transferred between the photoreceptor and the sense node is read out of the imager cell at the sense node.

* * * * *

UNITED STATES PATENT AND TRADEMARK OFFICE
CERTIFICATE OF CORRECTION

PATENT NO. : 6,909,126 B1
APPLICATION NO. : 10/057731
DATED : June 21, 2005
INVENTOR(S) : Janesick, Jim It is certified that error appears in the above-identified patent and that said Letters Patent is hereby corrected as shown below:

In the claims, column 9, line 38, reading "during an integration period and a V- level" should read –during an integration period, and a V- level--

In the claims, column 10, line 16, "tide" should be --tied--.

Signed and Sealed this

Fifteenth Day of August, 2006

JON W. DUDAS
*Director of the United States Patent and Trademark Office*